(12) United States Patent
Ahn et al.

(10) Patent No.: US 7,538,007 B2
(45) Date of Patent: May 26, 2009

(54) SEMICONDUCTOR DEVICE WITH FLOWABLE INSULATION LAYER FORMED ON CAPACITOR AND METHOD FOR FABRICATING THE SAME

(75) Inventors: Sang-Tae Ahn, Kyoungki-do (KR);
Dong-Sun Sheen, Kyoungki-do (KR);
Seok-Pyo Song, Kyoungki-do (KR);
Jong-Han Shin, Kyoungki-do (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 26 days.

(21) Appl. No.: 11/008,908

(22) Filed: Dec. 10, 2004

(65) Prior Publication Data

US 2005/0266650 A1    Dec. 1, 2005

(30) Foreign Application Priority Data

May 31, 2004    (KR) .................... 10-2004-0039228

(51) Int. Cl.
*H01L 21/8242*    (2006.01)
(52) U.S. Cl. .................. 438/396; 438/253; 438/763; 257/306; 257/E21.648
(58) Field of Classification Search .............. 257/306, 257/E21.648; 438/253, 396, 763
See application file for complete search history.

(56) References Cited

U.S. PATENT DOCUMENTS

| | | | | |
|---|---|---|---|---|
| 5,674,773 A | * | 10/1997 | Koh et al. .................... 438/396 |
| 5,880,039 A | * | 3/1999 | Lee .............................. 438/763 |
| 5,989,983 A | * | 11/1999 | Goo et al. .................... 438/473 |
| 6,013,583 A | * | 1/2000 | Ajmera et al. ............... 438/783 |
| 6,025,279 A | * | 2/2000 | Chiang et al. ............... 438/760 |
| 6,083,826 A | | 7/2000 | Kim et al. |
| 6,239,020 B1 | * | 5/2001 | Lou ............................. 438/624 |
| 6,368,906 B1 | * | 4/2002 | Shin et al. ................... 438/210 |
| 6,432,827 B1 | * | 8/2002 | Chien et al. ................. 438/692 |
| 6,458,721 B2 | | 10/2002 | Iyer |
| 6,706,646 B1 | * | 3/2004 | Lee et al. .................... 438/782 |
| 2001/0055889 A1 | * | 12/2001 | Iyer .......................... 438/758 |
| 2002/0045337 A1 | * | 4/2002 | Nam et al. .................. 438/631 |
| 2002/0127867 A1 | * | 9/2002 | Lee ............................. 438/694 |
| 2002/0137276 A1 | * | 9/2002 | Park .......................... 438/241 |
| 2002/0187657 A1 | * | 12/2002 | Morozumi .................. 438/789 |
| 2003/0036240 A1 | * | 2/2003 | Trivedi ....................... 438/383 |

FOREIGN PATENT DOCUMENTS

CN         1367531         9/2002

* cited by examiner

*Primary Examiner*—Douglas M Menz
*Assistant Examiner*—Steven J. Fulk
(74) *Attorney, Agent, or Firm*—Blakely, Sokoloff, Taylor & Zafman LLP

(57) ABSTRACT

Disclosed is a semiconductor device with a flowable insulation layer formed on a capacitor and a method for fabricating the same. Particularly, the semiconductor device includes: a capacitor formed on a predetermined portion of a substrate; an insulation layer formed by stacking a flowable insulation layer and an undoped silicate glass layer on a resulting substrate structure including the substrate and the capacitor; and a metal interconnection line formed on the insulation layer. The method includes the steps of: forming a capacitor on a predetermined portion of a substrate; forming an insulation layer by stacking a flowable insulation layer and an undoped silicate glass layer on a resulting substrate structure including the substrate and the capacitor; and forming a metal interconnection line on the insulation layer.

11 Claims, 3 Drawing Sheets

SEMICONDUCTOR DEVICE WITH FLOWABLE INSULATION LAYER FORMED ON CAPACITOR AND METHOD FOR FABRICATING THE SAME

FIELD OF THE INVENTION

The present invention relates to a semiconductor device; and more particularly, to a semiconductor device with an insulation layer on a capacitor and a method for fabricating the same.

DESCRIPTION OF RELATED ARTS

As is known well, a trend in micronization and large scale of integration of a semiconductor memory device is highly demanded to secure enough capacitance of a capacitor included in a dynamic random access memory (DRAM) cell. In order to obtain enough capacitance, a dielectric material is formed by stacking aluminum oxide ($Al_2O_3$) and hafnium oxide ($HfO_2$), or an upper electrode and a lower electrode of a capacitor are formed by using a metal such as titanium nitride (TiN).

Accordingly, in case of forming an insulation layer on top of the capacitor, the insulation layer should be formed essentially through a low-temperature process to prevent degradation of bottom layers of the capacitor for instance oxidization of a metal, degradation of properties of a dielectric material and diffusion.

Furthermore, a DRAM device is divided into a cell region in which a capacitor is formed and a peripheral circuit region where the capacitor is not formed. The capacitor in the cell region should be formed with a high height to secure the capacitance. Therefore, a height difference of at least 10,000 Å is generated in a boundary between the cell region and the peripheral circuit region.

Accordingly, it is required to employ an insulation material that is capable of being formed by a low-temperature process and overcoming the height difference, thereby enabling a planarization process as the insulation layer on the capacitor.

FIGS. 1A to 1B are cross-sectional views illustrating a conventional method for forming an insulation layer on top of capacitors among sequential processes of fabricating a DRAM device. Particularly, FIG. 1A shows the conventionally formed capacitors, and FIG. 1B shows the conventionally formed insulation layer on the capacitors.

Referring to FIG. 1A, a plurality of capacitors C are formed on a substrate structure provided with a bottom insulation layer 11, contact plugs 12 and an etch stop layer 13. Each of the capacitors C includes a lower electrode 14 being contacted to the corresponding contact plug 12 and having a cylinder shape, a dielectric layer 15 covering the lower electrode 14 and an upper electrode 16 formed on the dielectric layer 15. The capacitors C are typically formed in a DRAM cell region and are not formed in a peripheral circuit region. Therefore, there exists a height difference of at least 10,000 Å in a boundary between the cell region and the peripheral circuit region.

Referring to FIG. 1B, an undoped silicate glass (USG) formed with use of a plasma enhanced chemical vapor deposition (PECVD) method is employed as a top insulation layer D. As for the USG-based top insulation layer D formed with use of the PECVD method, a seam is generated from a bottom thin layer 17 of an early deposition stage. The seam is continuously generated up to a top thin layer 19 of a final deposition stage, passing though a middle thin layer 18 of an intermediate deposition stage. This seam is generated because of the height difference in the boundary between the cell region and the peripheral circuit region.

Subsequently, FIG. 1C is a cross-sectional view of a conventionally formed insulation layer on a capacitor, wherein the insulation layer is planarized and cleaned thereafter. Especially in this drawing, a problem related to the conventional method for forming the insulation layer on the capacitor is depicted.

As shown, the undoped silicate glass (USG)-based insulation layer D formed by the PECVD method is planarized through a chemical mechanical polishing (CMP) process or an etch-back process and is then cleaned up. Also, it is shown that a cavity 20 is formed in a region where the seam is generated.

This cavity 20 induces generation of etch remnants during a subsequent metal interconnection line formation process, and the etch remnants become a cause for forming a bridge between the metal interconnection lines.

Meanwhile, to remove the cavity 20 of the insulation layer D, a high density plasma-chemical vapor deposition (HDP-CVD) method having excellent planarization and step-coverage characteristics can be used to form the insulation layer D. However, the deposition mechanism of the HDP-CVD method is a repeating steps of etching and depositing, and thus, there is a disadvantage of generating plasma damage on bottom layers consisting the capacitor.

Furthermore, ozone-tetraethylorthosilicate ($O_3$-TEOS) having an excellent planarization characteristic can be used for the insulation layer D. However, if a concentration of ozone ($O_3$) increases in order to deposit a thick layer with a thickness of more than 20,000 Å, $O_3$-TEOS is dependent on the bottom layers exhibiting oxidization of the upper and lower electrodes.

In case of using a borophosphosilicate glass (BPSG) capable of reflowing because the BPSG is doped with boron (B) and phosphorus (p) as the insulation layer D, it is essential to employ a high-temperature thermal process for reflowing the BPSG at a temperature of 800° C. Therefore, using BPSG is not appropriate to perform a low-temperature process.

SUMMARY OF THE INVENTION

It is, therefore, an object of the present invention to provide a semiconductor device with a flowable insulation layer formed on a capacitor by performing a low-temperature process along with a good planarization characteristic but without degrading characteristics of bottom layers comprising the capacitor and a method for fabricating the same.

In accordance with one aspect of the present invention, there is provided a semiconductor device, including: a capacitor formed on a predetermined portion of a substrate; an insulation layer formed by stacking a flowable insulation layer and an undoped silicate glass layer on a resulting substrate structure including the substrate and the capacitor; and a metal interconnection line formed on the insulation layer.

In accordance with another aspect of the present invention, there is provided a method for fabricating a semiconductor device, including the steps of: forming a capacitor on a predetermined portion of a substrate; forming an insulation layer by stacking a flowable insulation layer and an undoped silicate glass layer on a resulting substrate structure including the substrate and the capacitor; and forming a metal interconnection line on the insulation layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, a semiconductor device with a flowable insulation layer on a capacitor and a method for fabricating the same in accordance with preferred embodiments of the present invention will be described with reference to the accompanying drawings.

Figure 2:
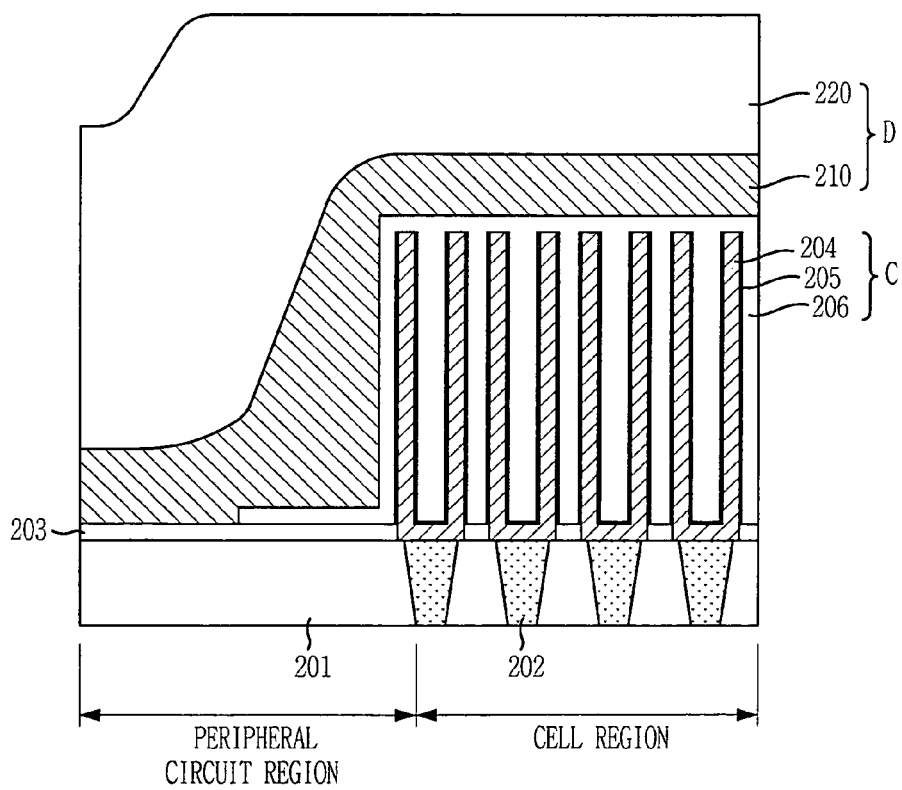
FIG. 2 is a cross-sectional view illustrating formation of an insulation layer on an a capacitor in accordance with a first embodiment of the present invention.
Figure 3:
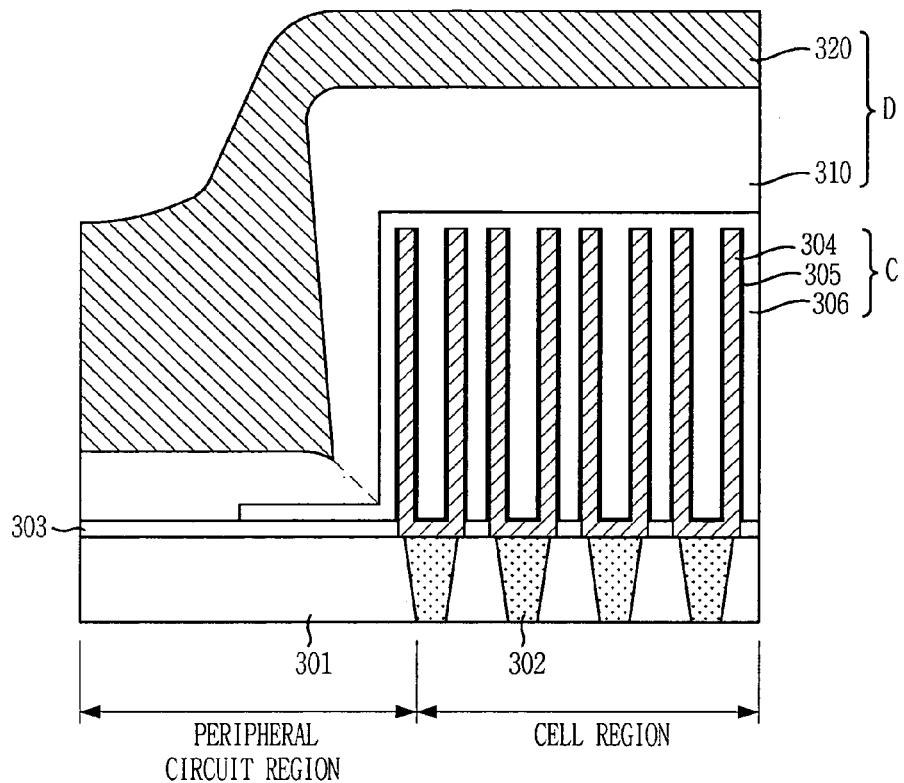
FIG. 3 is a cross-sectional view illustrating formation of an insulation layer on a capacitor in accordance with a second embodiment of the present invention.
Figure 4:
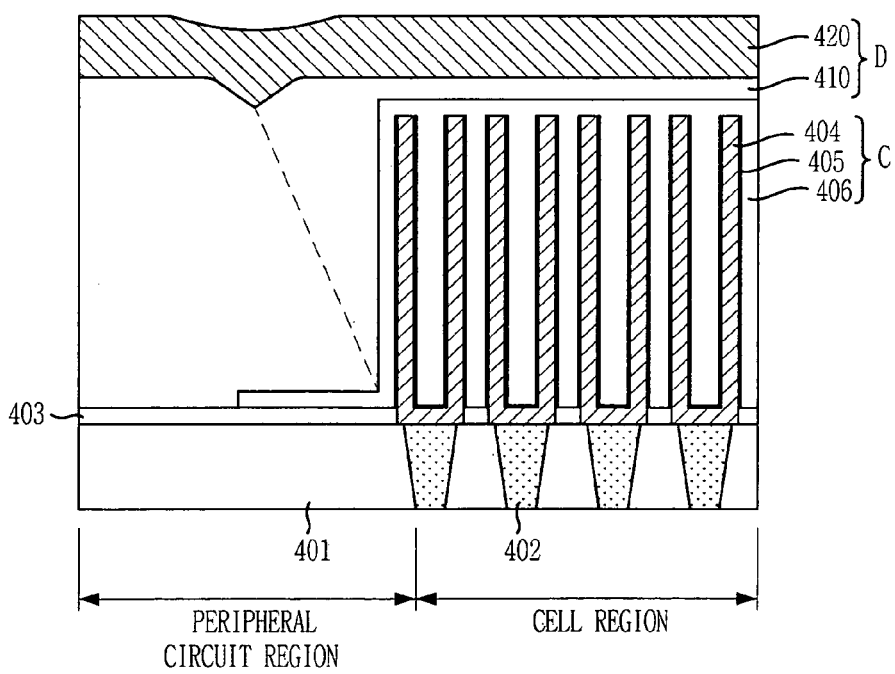
FIG. 4 is a cross-sectional view illustrating formation of an insulation layer on a capacitor in accordance with a third embodiment of the present invention.

FIGS. 2 to 4 are cross-sectional views of diverse substrate structures, wherein an insulation layer is formed on a capacitor in accordance with a first to a third embodiments of the present invention.

First, FIG. 2 shows one exemplary substrate structure in accordance with the first embodiment of the present invention.

As shown, a plurality of capacitors C are formed on a substrate provided with a first insulation layer 201, contact plugs 202 and an etch stop layer 203. Each of the capacitors C includes a lower electrode 204 being contacted to the contact plug 202 and having a cylinder shape, a dielectric layer 205 covering the lower electrode 204 and an upper electrode 206 formed on the dielectric layer 205. The capacitors C are formed in a typical DRAM cell region and are not formed in a peripheral region. Hence, there exists a height difference of at least approximately 10,000 Å in a boundary between the cell region and the peripheral region.

Subsequently, a flowable insulation layer 210 that does not generate a seam in region where a height difference is high by having flowability during the deposition of the flowable insulation layer 210 is formed on the capacitor C.

Especially, the flowable insulation layer 210 can be formed by employing a spin on dielectric (SOD) method, wherein a liquid source such hydrogen silsesquiozane (HSQ) or a methyl silsesquioxane (MSQ) is coated on a substrate rotating in a speed of approximately 60 rpm to approximately 10,000 rpm. Also, the flowable insulation layer 210 can be formed with use of a low pressure chemical vapor deposition (LPCVD) method using reaction sources such as silicon tetrahydride ($SiH_4$) and hydrogen peroxide ($H_2O_2$). Particularly, the LPCVD method using the reactive sources such as $SiH_4$ and $H_2O_2$ forms the flowable insulation layer 210 at a temperature, i.e., a temperature of a plate in which a wafer is placed, ranging from approximately −10° C. to approximately 40° C. under a pressure of less than approximately 100 Torr. The LPCVD method is a method, wherein a deposited thin layer is relatively planarized because of high flowability of the reaction agents contained in the thin layer during the deposition process.

After the above deposition process, a thermal process is subsequently performed to complete the formation of the flowable insulation layer 210. Herein, the thermal process is carried out for the purpose of removing impurities or water existed inside of the deposited flowable insulation layer 210 and densifying the flowable insulation layer 210. The thermal process proceeds in an atmosphere of oxygen ($O_2$), ozone ($O_3$), nitrogen ($N_2$), nitrogen oxide ($N_2O$) or a mixed gas of hydrogen ($H_2$) and oxygen ($O_2$) by employing one of a furnace thermal process and a rapid thermal process. The furnace thermal process is performed for more than approximately 5 minutes at a temperature ranging from approximately 200° C. to approximately 650° C. The rapid thermal process is performed for longer than approximately 1 second at a temperature greater than approximately 300° C.

As shown in the above, this type of the flowable insulation layer 210 can be subjected to a low-temperature process and has an excellent property of planarization. Therefore, the flowable insulation layer 210 can be used in a very useful manner as an inter-layer insulation layer, i.e., as the insulation layer on the capacitor, of a highly integrated and micronized semiconductor device.

An undoped silicate glass (USG)-based insulation layer 220 formed on the flowable insulation layer 210 by performing a plasma enhanced chemical vapor deposition (PECVD) method. A seam is not generated in the USG-based insulation layer 220 formed with use of the PECVD method because the flowable insulation layer 210 has already reduced a height difference of the substrate. The USG-based insulation layer 210 formed with use of the PECVD method has excellent properties of fast depositing speed and layer stability.

If the height difference between the cell region and the peripheral region is greater than approximately 10,000 Å, it is possible to form the flowable insulation layer 210 in a thickness ranging from approximately 500 Å to approximately 1000 Å and the USG-based insulation layer 220 in a thickness of approximately 200 Å to approximately 30,000 Å. Hereinafter, the flowable insulation layer 210 and the USG-based insulation layer 220 formed on the capacitors C will be referred to as a second insulation layer which is denoted as 'D' in FIG. 2.

Figure 1A:
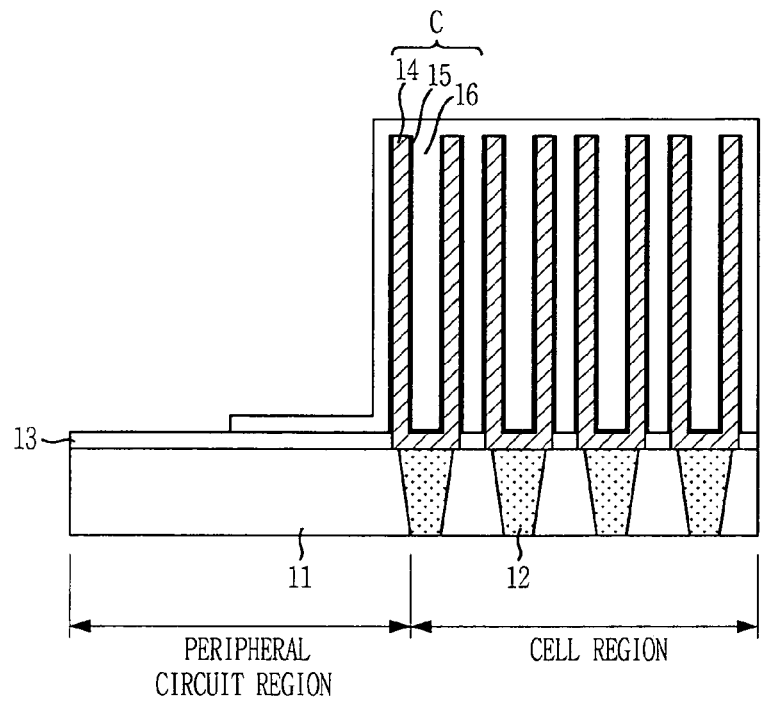
FIGS. 1A to 1B are cross-sectional views illustrating a conventional method for forming an insulation layer on a capacitor in a dynamic random access memory (DRAM) device.
Figure 1B:
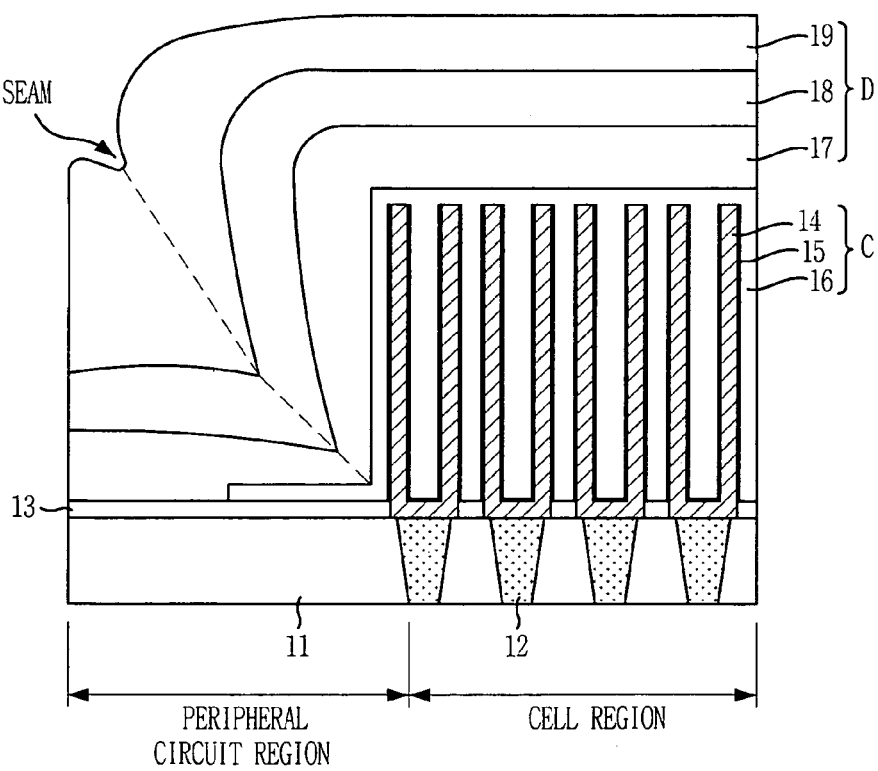
Figure 1C:
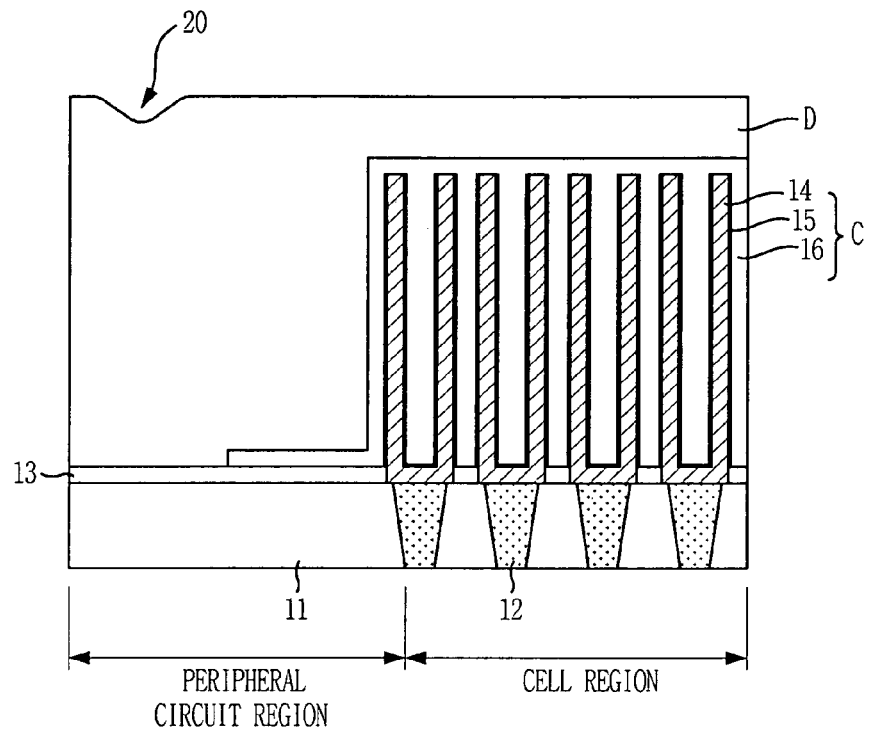
FIG. 1C is a cross-sectional view depicting a problem arising when the conventional method for forming an insulation layer on a capacitor is performed.

Subsequently, the above resulting substrate structure is planarized by etching or polishing the deposited second insulation layer D. It is preferred that the second insulation layer D has a remaining thickness ranging from approximately 500 Å to approximately 5,000 Å after the above planarization process. Since the seam is not generated due to the flowable insulation layer 210, a cavity typically generated when the conventional method is applied as described in FIG. 1C is not formed on the second insulation layer D after the substrate structure is planarized.

Various methods can be applied to the method to planarize the substrate structure. For instance, it is possible to employ a method for first selectively wet etching a predetermined thickness of the second insulation layer D disposed in a region having a high height difference, i.e., an upper portion of the capacitor, thereby reducing the height difference and then, applying a chemical mechanical polishing (CMP) process to the substrate structure for planarization.

FIG. 3 is a cross-sectional view showing another exemplary substrate structure, wherein an insulation layer is formed on a capacitor in accordance with a second embodiment of the present invention.

Referring to FIG. 3, a plurality of capacitors C are formed on a substrate provided with a first insulation layer 301, contact plugs 302 and an etch stop layer 303. Each of the capacitors C includes a lower electrode 304 being contacted to the corresponding contact plug 302 and having a cylinder shape, a dielectric layer 305 covering the lower electrode 304 and an upper electrode 306 formed on the dielectric layer 305. The capacitor C is formed in a typical DRAM cell region and is not formed on a peripheral region, thereby exhibiting a height difference of at least 10,000 Å in a boundary between the cell region and the peripheral region.

Subsequently, the USG-based insulation layer 310 formed by a PECVD method is formed on the capacitors C. At this time, a deposited thickness of the USG-based insulation layer 310 should be lower than the height difference. The seam is generated when the USG-based insulation layer is formed on the capacitor by performing the PECVD method under the state of high height difference. However, according to the second embodiment, the USG-based insulation layer 310 is formed with a relatively decreased thickness, and thus, a depth of the seam is not severe.

Next, a flowable insulation layer 320 is formed on the USG-based insulation layer 310. At this time, a height of the flowable insulation layer 320 in the peripheral region is higher than that of the capacitor. Even if a little bit of seams are generated due to the formation of the USG-based insulation layer 310, the seam is not generated after the formation of the flowable insulation layer 320.

As explained in the first embodiment, a spin on dielectric (SOD) method of coating the substrate structure with a liquid source such as HSQ or MSQ as the substrate structure rotates in a speed of approximately 60 rpm to approximately 1,000 rpm can be used to form the flowable insulation layer 320. Also, the LPCVD method using reaction sources such as $SiH_4$ and $H_2O_2$ can be used to form the flowable insulation layer 320.

The formation of the flowable dielectric layer 320 undergoes a deposition process and a thermal process. After the deposition process, the thermal process is performed to remove impurities or water existed inside of the deposited flowable insulation layer 320 and then, to densify the flowable insulation layer 320. The thermal process proceeds in an atmosphere of $O_2$, $O_3$, $N_2$, $N_2O$ or a mixed gas of $H_2$ and $O_2$ with use of a furnace thermal process or a rapid thermal process. The furnace thermal process is performed for longer than approximately 5 minutes at a temperature ranging from approximately 200° C. to approximately 650° C. The rapid thermal process is performed for longer than approximately 1 second at a temperature greater than approximately 300° C. Hereinafter, the flowable insulation layer 320 and the USG-based insulation layer 310 are referred to as a second insulation layer which will be denoted as 'D' in FIG. 3.

Subsequently, the resulting substrate structure is planarized by etching or polishing the deposited second insulation layer D. Herein, a method for planarizing the substrate structure is same as the method employed in the first embodiment. Meanwhile, this planarization step may not be necessary in accordance with the second embodiment of the present invention.

FIG. 4 is a cross-sectional view of a substrate structure, wherein an insulation layer is formed on a capacitor in accordance with a third embodiment of the present invention.

Referring to FIG. 4, a plurality of capacitors C are formed on a substrate provided with a first insulation layer 401, contact plugs 402 and an etch stop layer 403. Each of the capacitors C includes a lower electrode 404 being contacted to the corresponding contact plug 402 and having a cylinder shape, a dielectric layer 405 covering the lower electrode 404 and an upper electrode 406 formed on the dielectric layer 405. The capacitor C is formed in a typical DRAM cell region and is not formed in a peripheral region, thereby exhibiting a height difference of at least 10,000 Å in a boundary between the cell region and the peripheral region.

Subsequently, USG-based insulation layer 410 is formed on the substrate provided with the plurality of capacitors C with use of a PECVD method. At this time, the USG-based insulation layer is formed more thickly than the height difference between the cell region and the peripheral region. Then, the USG-based insulation layer 410 is planarized through an etching process and/or a polishing process. At this time, when the USG-based insulation layer 410 is formed as mentioned in the conventional method, there may be generated seams which further cause cavity formation after the planarization process.

In accordance with a third embodiment of the present invention, the flowable insulation layer 420 is formed in a thickness enough to bury the cavity and to planarize the resulting substrate structure, i.e., in a thickness ranging from approximately 200 Å to approximately 5,000 Å. Hereinafter, the flowable insulation layer 420 and the USG-based insulation layer 410 are referred to as a second insulation layer which will be denoted as 'D' in FIG. 4.

Not only the cavity generated on a surface of the USG-based insulation layer 410 but also a defect such as scratching produced during the planarization process, e.g., a chemical mechanical polishing (CMP) process, can be removed because of the formation of the flowable insulation layer 420. That is, a problem in bridge formation caused by the cavity and the defect in the causes of forming a metal interconnection line on the second insulation layer D can be solved.

As like the precedent embodiments, a SOD method or a LPCVD method using reaction sources such as $SiH_4$ and $H_2O_2$ is employed to form the flowable insulation layer 420. Also, the formation of the flowable insulation layer 420 is completed through a deposition process and a thermal process.

In accordance with the present invention, a capacitor is formed with a high height in the cell region to secure a high capacitance in highly integrated and micronized devices such as a DRAM, thereby exhibiting a great height difference between the cell region and the peripheral region, and a USG-based insulation layer having a good layer stability and a flowable insulation layer having tolerance of a low-temperature process and a good planarization characteristic are formed on the capacitor. As a result, it is possible to prevent deterioration of bottom layers comprising the capacitor during the low-temperature process and bridge formation between subsequent metal interconnection lines during the planarization process. Eventually, there is an effect of increasing yields of highly integrated semiconductor devices.

The present application contains subject matter related to the Korean patent application No. KR 2004-0039228, filed in the Korean Patent Office on May 31, 2004 the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor memory device having a cell area and a peripheral area, comprising:
    a capacitor formed on the cell area of a substrate;
    an insulation layer formed by stacking a flowable insulation layer and an undoped silicate glass layer over the cell area and the peripheral area;
    a metal interconnection line formed on the insulation layer;

wherein the flowable insulation layer is formed by a low pressure chemical vapor deposition method using reaction sources of silicon tetrahydride ($SiH_4$) and hydrogen peroxide ($H_2O_2$) at a temperature ranging from approximately −10° C. to approximately 40° C. under a pressure of less than approximately 100 Torr, wherein the flowable insulation layer covers whole regions of the cell area and the peripheral area with a thickness less than a height of the capacitor and the undoped silicate glass layer is formed over the flowable insulation layer by employing a plasma enhanced chemical vapor deposition, and wherein the flowable insulation layer is formed by a thermal process employing one of a furnace thermal process at a temperature ranging from 200° C. to 650° C. and a rapid thermal process at a temperature greater than 300° C.

2. The semiconductor device of claim 1, wherein the flowable insulation layer is formed on the resulting structure and the undoped silicate glass layer is formed on the flowable insulation layer.

3. The semiconductor device of claim 2, wherein the flowable insulation layer is obtained by employing a spin on dielectric method by which a liquid source material is coated on the rotating substrate which is subsequently subjected to a thermal process.

4. The semiconductor device of claim 3, wherein the liquid source material is one of hydrogen silsesquioxane (HSQ) and methyl silsesquioxane (MSQ).

5. The semiconductor device of claim 2, wherein the flowable insulation layer is obtained by a low pressure chemical vapor deposition method using reaction sources such of silicon tetrahydride ($SiH_4$) and hydrogen peroxide ($H_2O_2$).

6. A method for fabricating a semiconductor memory device having a cell area and a peripheral area, comprising:
    forming a capacitor on the cell area of a substrate;
    forming a flowable insulation layer over the cell area and the peripheral area with a thickness less than a height of the capacitor;
    forming an undoped silicate glass layer on the flowable insulation layer by employing a plasma enhanced chemical vapor deposition;
    performing a planarization process to the undoped silicate glass layer and the flowable insulation layer; and
    forming a metal interconnection line on the flowable insulation layer;
    wherein the forming the flowable insulation layer includes:
        depositing a thin layer using a low pressure chemical vapor deposition method by using reaction sources of silicon tetrahydride ($SiH_4$) and hydrogen peroxide ($H_2O_2$) at a temperature ranging from approximately −10° C. to approximately 40° C. under a pressure of less than approximately 100 Torr,
    wherein the flowable insulation layer covers whole regions of the cell area and the peripheral area and the undoped silicate glass layer is formed over the flowable insulation layer, and
    wherein the flowable insulation layer is formed by a thermal process employing one of a furnace thermal process at a temperature ranging from 200° C. to 650° C. and a rapid thermal process at a temperature greater than 300° C.

7. The method of claim 6, wherein the planarization process is performed by one of an etching process and a polishing process.

8. A method for fabricating a semiconductor memory device having a cell area and a peripheral area, comprising:
    forming a capacitor on the cell area of a substrate;
    forming an insulation layer by stacking a flowable insulation layer and an undoped silicate glass layer over the cell area and the peripheral area; and
    forming a metal interconnection line on the insulation layer,
    wherein the flowable insulation layer covers whole regions of the cell area and the peripheral area with a thickness less than a height of the capacitor, and the undoped silicate glass layer is formed over the flowable insulation layer,
    wherein the forming the flowable insulation layer includes
    coating the substrate with a liquid source material selected from hydrogen silsesquioxane (HSQ) and methyl silsesquioxane (MSQ) in the form of a thin layer by rotating the substrate; and
    performing a thermal process to the coated thin layer.

9. The method of claim 8, wherein the thermal process proceeds in an atmosphere selected from a group consisting of oxygen ($O_2$), ozone ($O_3$), nitrogen ($N_2$), nitrogen oxide ($N_2O$) and a mixed gas of hydrogen ($H_2$) and oxygen ($O_2$).

10. A semiconductor memory device having a cell area and a peripheral area, comprising:
    a capacitor formed on the cell area of a substrate;
    an insulation layer formed by stacking a flowable insulation layer and an undoped silicate glass layer over the cell area and the peripheral area; and
    a metal interconnection line formed on the insulation layer,
    wherein the flowable insulation layer covers whole regions of the cell area and the peripheral area with a thickness less than a height of the capacitor and the undoped silicate glass layer is formed over the flowable insulation layer, and
    wherein the flowable insulation layer is obtained by employing a spin on dielectric method by which a liquid source material is coated on the rotating substrate which is subsequently subjected to the thermal process.

11. The semiconductor device of claim 10, wherein the liquid source material is one of hydrogen silsesquioxane (HSQ) and methyl silsesquioxane (MSQ).

* * * * *